(12) United States Patent  
Besterman et al.

(10) Patent No.: US 10,827,640 B2  
(45) Date of Patent: Nov. 3, 2020

(54) SECURE ADD-ON BRACKETS AND BEZEL FOR LOCKING DEVICES AND/OR SLOTS IN A COMPUTER RACK

(71) Applicant: International Business Machines Corporation, Armonk, NY (US)

(72) Inventors: Paula Besterman, Cary, NC (US); Aaron R. Cox, Tucson, AZ (US); Camillo Sassano, Durham, NC (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 15/486,198

(22) Filed: Apr. 12, 2017

(65) Prior Publication Data

US 2018/0303005 A1 Oct. 18, 2018

(51) Int. Cl.

| | |
|---|---|
| *H05K 7/14* | (2006.01) |
| *E05B 65/467* | (2017.01) |
| *F16M 11/04* | (2006.01) |
| *F16M 13/02* | (2006.01) |
| *F16M 11/22* | (2006.01) |
| *E05C 19/00* | (2006.01) |

(52) U.S. Cl.  
CPC ......... *H05K 7/1489* (2013.01); *E05B 65/467* (2013.01); *F16M 11/046* (2013.01); *F16M 11/22* (2013.01); *F16M 13/02* (2013.01); *E05C 19/003* (2013.01); *F16M 2200/02* (2013.01)

(58) Field of Classification Search  
CPC .... H05K 7/1489; H05K 7/186; F16M 13/022; F16M 2200/02; F16M 11/046; F16M 11/22; F16M 13/02; E05B 65/44; E05B 73/0082; E05B 67/36; E05B 65/467; E05C 19/003; Y10T 70/5097; Y10T 70/51; Y10S 70/64

See application file for complete search history.

(56) References Cited

U.S. PATENT DOCUMENTS

| | | | | |
|---|---|---|---|---|
| 1,239,802 A | * | 9/1917 | Macbeth | ................. E05C 19/18 292/258 |
| 1,494,717 A | * | 5/1924 | Sell | ....................... B60R 25/066 70/203 |
| 3,009,582 A | * | 11/1961 | Degener | .............. A47B 57/402 211/191 |
| 3,273,935 A | * | 9/1966 | Carson | .................... E05B 83/16 292/288 |
| 3,665,736 A | * | 5/1972 | Wilson | ................... E05B 73/00 292/259 R |

(Continued)

OTHER PUBLICATIONS

Dell, "PowerEdge R710 Technical Guidebook," Jan. 2011, pp. 1-63.

*Primary Examiner* — Ko H Chan  
(74) *Attorney, Agent, or Firm* — Zilka-Kotab, P.C.

(57) ABSTRACT

A product according to one embodiment includes a first bracket for coupling to a rail of a computer rack, and a bezel having a lock for selectively locking the bezel to the first bracket. A method according to another embodiment includes coupling a first bracket to a rail of a computer rack, and coupling a bezel to the first bracket. A system according to yet another embodiment includes a computer rack, a first bracket coupled to a rail of the computer rack, and a bezel having a lock for selectively locking the bezel to the first bracket.

20 Claims, 8 Drawing Sheets

(56) References Cited

U.S. PATENT DOCUMENTS

| | | | | |
|---|---|---|---|---|
| 4,189,250 | A * | 2/1980 | Abbott | A47B 57/402 |
| | | | | 211/192 |
| 4,958,867 | A * | 9/1990 | Champagne | D06F 39/14 |
| | | | | 292/258 |
| 5,267,688 | A * | 12/1993 | Benefield | A47G 29/1201 |
| | | | | 232/17 |
| 5,419,165 | A * | 5/1995 | Perkins | E05B 67/383 |
| | | | | 292/258 |
| 5,520,291 | A * | 5/1996 | Graham | A47B 81/005 |
| | | | | 211/4 |
| 6,259,605 | B1 * | 7/2001 | Schmitt | G06F 1/181 |
| | | | | 361/724 |
| 6,628,512 | B2 | 9/2003 | Searby et al. | |
| 6,695,149 | B1 * | 2/2004 | Cote | H05K 7/183 |
| | | | | 211/182 |
| 6,758,353 | B2 * | 7/2004 | Orr | A47B 47/03 |
| | | | | 211/183 |
| 6,909,611 | B2 * | 6/2005 | Smith | G06F 1/181 |
| | | | | 307/43 |
| 6,925,843 | B1 | 8/2005 | Pols Sandhu et al. | |
| 7,152,936 | B2 | 12/2006 | Tarasewicz | |
| 7,156,475 | B2 * | 1/2007 | Gloger, Jr. | A47B 81/00 |
| | | | | 312/216 |
| 7,269,020 | B2 * | 9/2007 | Wang | G06F 1/183 |
| | | | | 312/223.2 |
| 7,510,421 | B2 * | 3/2009 | Fransen | H01R 9/2416 |
| | | | | 439/449 |
| 7,681,421 | B2 * | 3/2010 | Cannon | E05C 19/003 |
| | | | | 200/43.14 |
| 7,850,013 | B1 * | 12/2010 | Kramer | E05B 73/0082 |
| | | | | 211/26 |
| 8,939,523 | B2 * | 1/2015 | Yu | G06F 1/182 |
| | | | | 312/216 |
| 9,078,349 | B1 * | 7/2015 | Lewis | H05K 5/0204 |
| 9,247,318 | B2 | 1/2016 | Teeter | |
| 9,271,884 | B2 * | 3/2016 | Mitchell | A61G 5/10 |
| 9,357,669 | B2 * | 5/2016 | House | H04Q 1/14 |
| 9,512,646 | B1 * | 12/2016 | Jonas | E05B 65/0089 |
| 2003/0233855 | A1 * | 12/2003 | Pirveysian | E05B 65/467 |
| | | | | 70/62 |
| 2004/0035995 | A1 * | 2/2004 | Chen | H02G 11/00 |
| | | | | 248/282.1 |
| 2004/0232092 | A1 * | 11/2004 | Cash | A47B 73/008 |
| | | | | 211/4 |
| 2005/0200247 | A1 | 9/2005 | Tarasewicz | |
| 2012/0104200 | A1 * | 5/2012 | Grady, IV | H05K 7/1489 |
| | | | | 248/222.14 |
| 2014/0268514 | A1 | 9/2014 | Teeter | |
| 2014/0338263 | A1 * | 11/2014 | Huddleston | E05C 21/00 |
| | | | | 49/62 |
| 2017/0257969 | A1 * | 9/2017 | Kuan | E05B 65/44 |
| 2019/0048630 | A1 * | 2/2019 | Ramus | E05C 19/003 |

\* cited by examiner

SECURE ADD-ON BRACKETS AND BEZEL FOR LOCKING DEVICES AND/OR SLOTS IN A COMPUTER RACK

FIELD OF THE INVENTION

The present invention relates to computer rack locking devices, and more particularly, this invention relates to the access and security of computers and/or the slots in a computer rack.

BACKGROUND

Some computer racks are designed and fabricated to meet specific conventional design standards. One such design standard includes the Electronic Industries Alliance (EIA) standard. Computers inserted into the computer racks may also be designed and/or fabricated according to the same and/or similar standards to facilitate conformity.

In co-siting environments, computer racks are often shared by different customers (also known as "co-location systems"). The contents of such computer racks often host equipment of different types. For example, a computer rack may house computers with different heights (referred herein as "U(s)"), manufacturer types, interface/access assemblies, etc.

Some computer racks include a locking door. However, where multiple customers share a common computer rack, the various customers share the same key, and therefore have access to the other customers' computers. Moreover, some rack mounted systems themselves may have a locking mechanism, but such mechanisms are specific to the particular system, and generally only cover the front of the system.

SUMMARY

A product according to one embodiment includes a first bracket for coupling to a rail of a computer rack, and a bezel having a lock for selectively locking the bezel to the first bracket.

A method according to another embodiment includes coupling a first bracket to a rail of a computer rack, and coupling a bezel to the first bracket.

A system according to yet another embodiment includes a computer rack, a first bracket coupled to a rail of the computer rack, and a bezel having a lock for selectively locking the bezel to the first bracket.

Other aspects and advantages of the present invention will become apparent from the following detailed description, which, when taken in conjunction with the drawings, illustrate by way of example the principles of the invention.

DETAILED DESCRIPTION

Figure 1A:
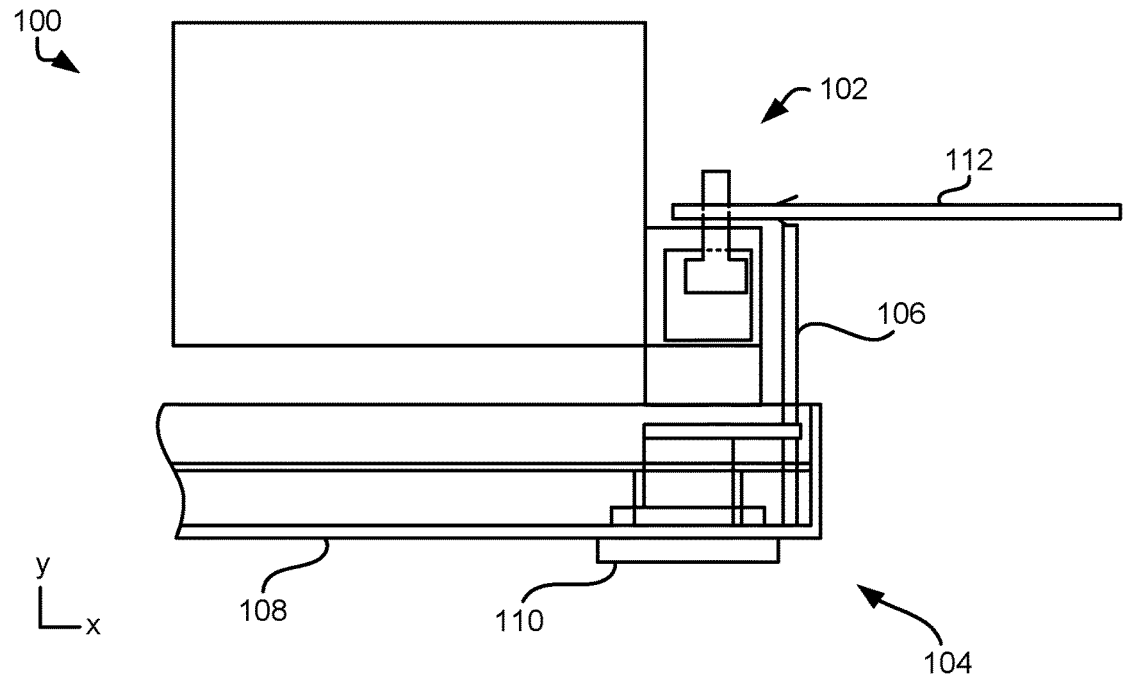
FIG. 1A is a partial top down view of a product having a bracket and a bezel in use with a computer rack, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of brackets and a bezel for locking devices and/or slots in a computer rack.

In one general embodiment, a product includes a first bracket for coupling to a rail of a computer rack, and a bezel having a lock for selectively locking the bezel to the first bracket.

In another general embodiment, a method includes coupling a first bracket to a rail of a computer rack, and coupling a bezel to the first bracket.

In yet another general embodiment, a system includes a computer rack, a first bracket coupled to a rail of the computer rack, and a bezel having a lock for selectively locking the bezel to the first bracket.

Conventional computer racks mount customer equipment in open racks, e.g., racks without doors or sides. However, these computer racks do not allow the locking of each customer's individually mounted equipment that often includes the customer's sensitive and/or private data.

Other conventional computer racks include a large security door that covers the entire rack frame, where different customers use the same key to unlock the security door to access computers mounted on the computer rack. However, the shared key to the rack door does not provide individual customer security, which thereby compromises individual computer privacy. Moreover, if the rack door does not provide individual customer security, these customers may not wish to use a rack door.

Various embodiments described herein include a product having bracket(s) and a bezel having a lock for selectively locking individual customer devices such as computers, servers, networking devices, storage devices, etc. and/or a slot in a computer rack. Further embodiments include the product and the computer rack.

While much of the following description describes the product in conjunction with a computer rack, it should be understood that some embodiments include the product alone.

FIGS. 1A-2B depict a system 100, in accordance with one embodiment. As an option, the present system 100 may be implemented in conjunction with features from any other embodiment listed herein, such as those described with reference to the other FIGS. Of course, however, such system 100 and others presented herein may be used in various applications and/or in permutations which may or may not be specifically described in the illustrative embodiments listed herein. Further, the system 100 presented herein may be used in any desired environment.

Referring now to FIG. 1A, system 100 includes a product 104 for selectively locking a device or slot in the computer rack 102. For present purposes, a slot may be defined as a space in the computer rack between the rack rails 112 for receiving a device. The dimensions of a slot preferably correspond to some rack unit value "U" or multiple thereof. Typical slots are 1U, 2U, 3U, or more U's high, and in a simple rack do not have barriers defining the slots. Moreover, in some approaches, a slot may not be defined in a computer rack 102 until the slot is allocated to an entity, e.g., a 2U slot is rented to a customer for inclusion of the customer's device therein.

According to various embodiments, the computer rack 102 may be configured to accept any type of computer, e.g., a server, a microcomputer, a network hub, etc. Product 104 includes a first bracket 106 for coupling to a rail 112 of the computer rack 102. One exemplary mode of coupling between the first bracket 106 and the rail 112 will be described in greater detail elsewhere herein, e.g. see FIGS. 2A-2B.

While the first bracket 106 may have any desired dimension that does not cover all slots in a given rack frame, according to various embodiments, the first bracket 106 may have features that correspond to EIA specifications. According to one approach, the first bracket 106 may be compliant with the EIA-310 specification that standardizes features of a standard rack, for example, rack unit dimensions, vertical hole spacing, horizontal hole spacing, rack opening, front panel width, etc. According to another approach, the first bracket 106 may be compliant with a computer and/or rack specification that would be appreciated by one skilled in the art upon reading the present descriptions.

Product 104 also includes a bezel 108 having a lock 110 for selectively locking the bezel 108 to the first bracket 106. According to various embodiments, the bezel 108 may be configured to individually cover an outer face of a slot of the computer rack 102, and anything in the slot, e.g., to provide individual security to a computer stored in the computer rack 102 behind the product 104, thereby preventing unauthorized access to the computer and thus protecting the security and privacy of the customer of the locked computer from other users and/or person(s) who may have access to the computer rack 102.

Figure 1B:
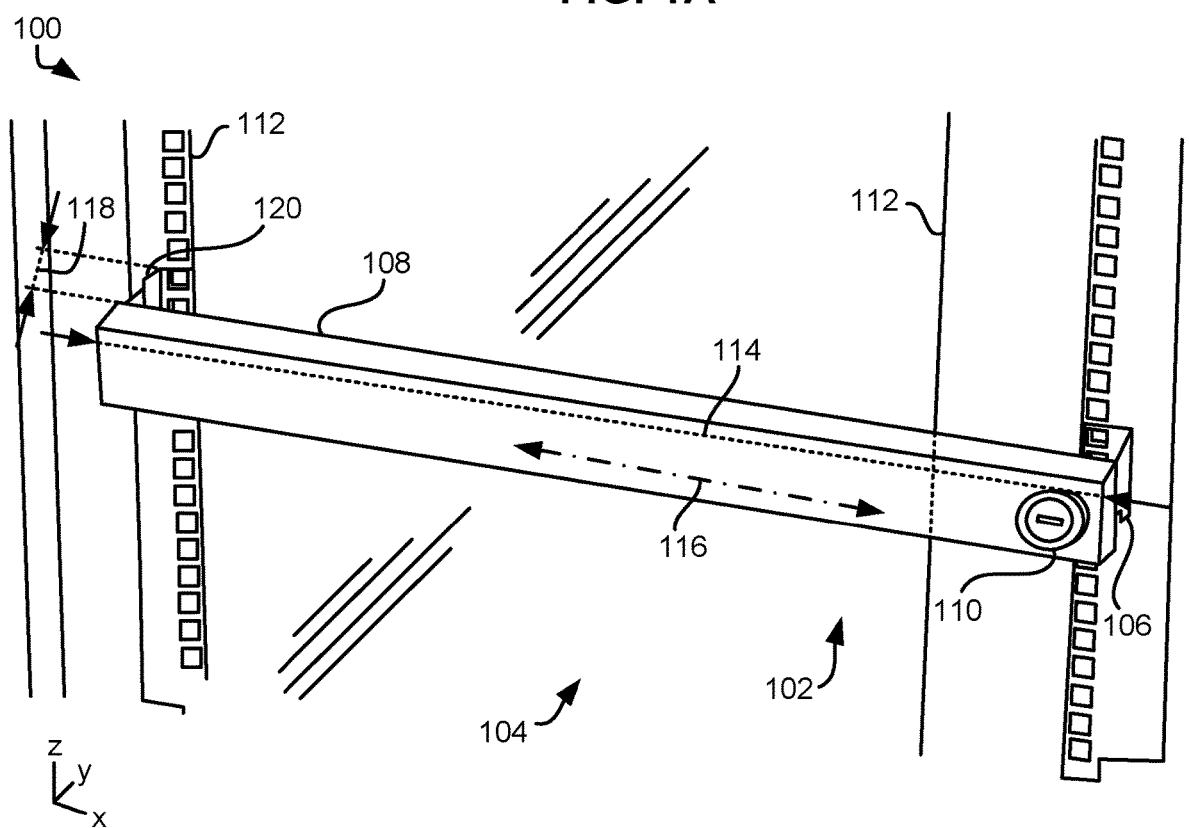
FIG. 1B is a partial perspective front view of a product having a bracket and a bezel in use with a computer rack, in accordance with one embodiment.

According to one or more approaches, the bezel 108 may cover an opening of an at least temporarily empty slot of the computer rack 102 when locked to the first bracket 106, e.g., see FIG. 1B. Covering an opening of an at least temporarily empty slot of the computer rack 102 may provide security/selective access to a partially populated or empty computer rack 102, which may be desirable to a user and/or manager of the computer rack 102. Covering an opening of an at least temporarily empty slot of the computer rack 102 may also prevent unauthorized users from claiming temporarily empty computer rack slots for their use.

According to various embodiments, the bezel 108 may vary in dimensions in accordance with the number rack units or "U's" of slots and/or mounted devices in the computer rack 102. According to various approaches, the slots may be 1U, 2U, any multiple of the U dimension, etc. For example, assuming for illustrative purposes that the computer rack 102 included a 3U server and a 1U network hub (both mounted in slots of the computer rack 102), a bezel 108 with a 1U height may be configured to cover an outer face of the 1U network hub, and another bezel 108 with a 3U height may be configured to cover an outer face of the 3U server. According to another approach, a bezel 108 with a 4U height may be configured to cover both the 3U server and the 1U network hub.

Referring now to FIG. 1B, a partial perspective front view of system 100 illustrates a second bracket 120 of product 104. Product 104 may include the second bracket 120 for pivotally coupling with the bezel 108.

According to various embodiments, a width 114 of the bezel 108 along a longitudinal axis 116 thereof may be adjustable. The width 114 of the bezel 108 along a longitudinal axis 116 thereof being adjustable may enable product 104 to be implemented in computer racks regardless of the width between rails of the computer rack to which the brackets 106, 120 are coupled. This may be particularly desirable in non-traditional and/or custom built computer racks, e.g., racks that do not conform to EIA standards.

Various mechanisms for enabling adjustment of the width 114 of the bezel 108 may be used. According to one approach, the width 114 of the bezel 108 may be adjustable by using a gear and/or ratchet. According to another approach, the width 114 of the bezel 108 may be adjustable by using a sliding track/rail that may be locked into position once the bezel 108 is adjusted to a desirable width 114. According to yet another approach, the width 114 of the bezel 108 may be adjustable by adding and/or removing bezel portions to the bezel 108, e.g., similar to adding/removing leaves to a table.

According to various embodiments, the bezel 108 may include a mechanism for adjusting a distance 118 of the bezel 108 from the computer rack 102. The bezel 108 including a mechanism for adjusting the distance 118 of the bezel 108 from the computer rack 102 may enable product 104 to be implemented in any computer rack, regardless of whether a computer residing in a slot of the computer rack 102 extends beyond the rails 112 of a computer rack 102. For example, according to one approach, a computer residing in a slot of the computer rack 102 may include face handles that extend beyond the rails 112 of the computer rack 102. In such an approach, the bezel 108 may be adjusted to a desired distance 118 from the computer rack 102 to cover the handles and the face of the computer.

In response to the bezel 108 being adjusted to a desired distance 118 from the computer rack 102, the bezel 108 may be locked to the first bracket 106.

According to one approach, the bezel 108 may include a worm screw mechanism for adjusting the distance 118 of the bezel 108 from the computer rack 102. In such an approach, a user installing the bezel 108 to the computer rack 102 may manually turn the worm screw to adjust the distance 118 of the bezel 108 from the computer rack 102. In such an approach, a user may additionally and/or alternatively press on the bezel 108 when installing the bezel 108 to the computer rack 102, where a force applied to the bezel 108 by the user translates to a turning of the worm screw and thereby an adjustment of the distance of the bezel 108 from the computer rack 102.

According to another approach, the bezel 108 may include one or more ratchet mechanisms for adjusting the distance 118 of the bezel 108 from the computer rack 102. The ratchet mechanism may be used to adjust the distance of the bezel 108 from the computer rack 102 in response to a force being applied to be bezel 108.

According to one approach, the force being applied to the bezel 108 may involve a user pressing on the bezel 108. According to another approach, the force being applied to the bezel 108 may be generated by an electrical current, e.g., where the electrical current powers the ratchet mechanism to increase and/or decrease the distance of the bezel 108 from the computer rack 102.

According to yet another approach, the bezel 108 may include one or more gear mechanisms for adjusting the distance 118 of the bezel 108 from the computer rack 102. In such an approach, the gear mechanism may include a resistance threshold mechanism that stops a winding of the gear mechanism in response to the bezel 108 contacting a portion of system 100, e.g., a stop tab, rails 112, a handle of a computer, etc., and thereby experiencing a counterforce. In such an approach, the gear mechanism may also and/or alternatively be configured to be turned by a user and thereby adjust the distance 118 of the bezel 108 from the computer rack 102.

According to other approaches, the bezel 108 may alternatively and/or additionally include one or more other mechanisms for adjusting the distance 118 of the bezel 108 from the computer rack 102 that would be appreciated by one skilled in the art upon reading the present descriptions.

According to various embodiments, locking the bezel 108 to the first bracket 106 and/or the second bracket 120 may be used to secure any outer-facing portion of a device that may be stored in the computer rack 102. According to one approach, as illustrated in FIGS. 1A-1B, the bezel 108 may cover a front opening of a slot of the computer rack 102 when locked to the first bracket 106 and/or the second bracket 120.

According to another approach, the bezel 108 may cover a back opening of a slot of the computer rack 102 when locked to the first bracket 106 and/or the second bracket 120.

According to yet another approach, the bezel 108 may cover a side opening of a slot of the computer rack 102 when locked to the first bracket 106 and/or the second bracket 120.

Covering one or more accessible portions of one or more slots of the computer rack 102 with one or more bezels 108 may provide privacy and/or security for computers and other devices in the computer rack 102. For example, one or more computer ports, e.g., universal serial bus (USB) ports, high definition multimedia interface (HDMI) ports, Ethernet ports, etc., may be covered by the bezel 108 in response to locking the bezel 108 to the first bracket 106 and/or the second bracket 120. According to another example, one or more computer displays, status lights, etc. may be covered by the bezel 108 in response to locking the bezel 108 to the first bracket 106 and/or the second bracket 120.

Figure 1C:
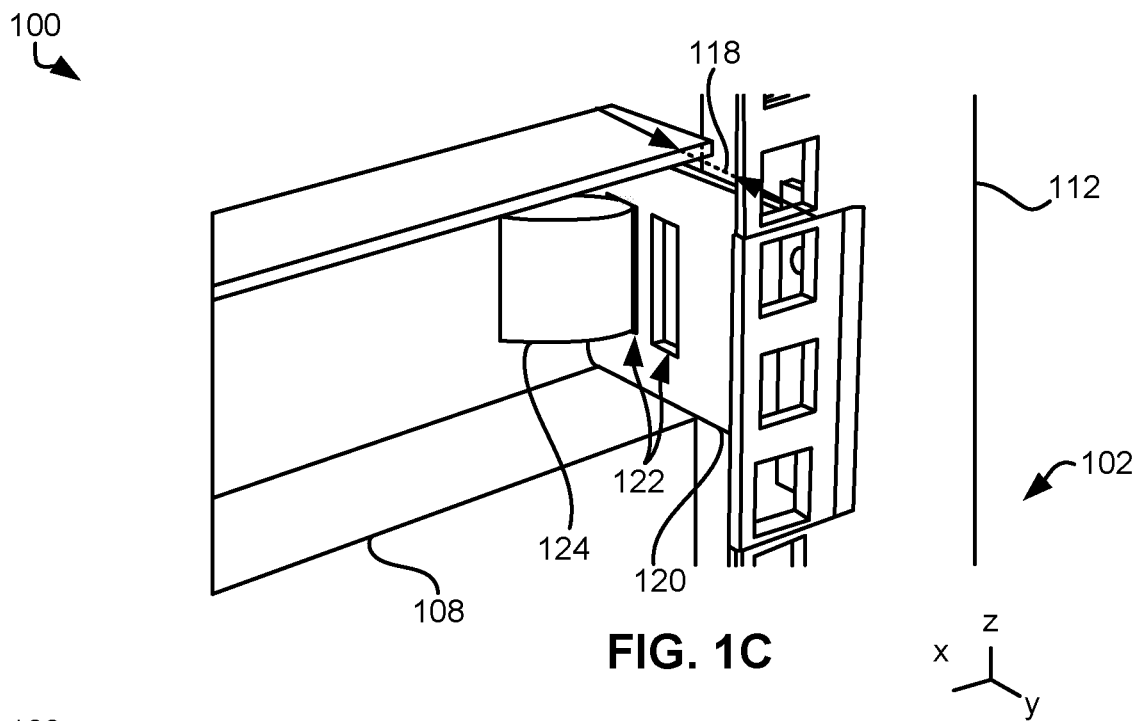
FIG. 1C is a partial internal view of a product having a bracket and a bezel in use with a computer rack, in accordance with one embodiment.

Referring now to FIG. 1C, a partial internal view of the second bracket 120 and bezel 108 is illustrated in accordance with one embodiment. The second bracket 120 is illustrated as coupled to the rail 112. The second bracket 120 may be pivotally coupled with the bezel 108, detachably coupled to the bezel 108, etc. using any type of configuration, such as a hinge, tongue and groove, etc. For example, as shown, a pivot portion 124 of the bezel 108 pivotally couples with a notch 122 of the second bracket 120, thereby securing the bezel 108 to the second bracket 120 when the bezel is in a closed position, and allowing detachment of the bezel 108 to the second bracket 120 when the bezel is in an open position, as depicted in FIG. 1C.

It should again be noted that the coupling type between the second bracket 120 and the bezel 108 may vary depending on the embodiment. According to various embodiments, the second bracket 120 may be coupled with the bezel 108 using one or more coupling mechanisms, which may include pivotable coupling, locking, etc. For example, although FIG. 1C illustrates the second bracket 120 pivotally coupled to the bracket via the pivot portion 124, the second bracket 120 may additionally and/or alternatively be coupled to the bezel 108 using a lock on the bezel 108 that is configured to couple the second bracket 120 with the bezel 108 without pivoting, e.g., see FIGS. 3-4B.

Figure 1D:
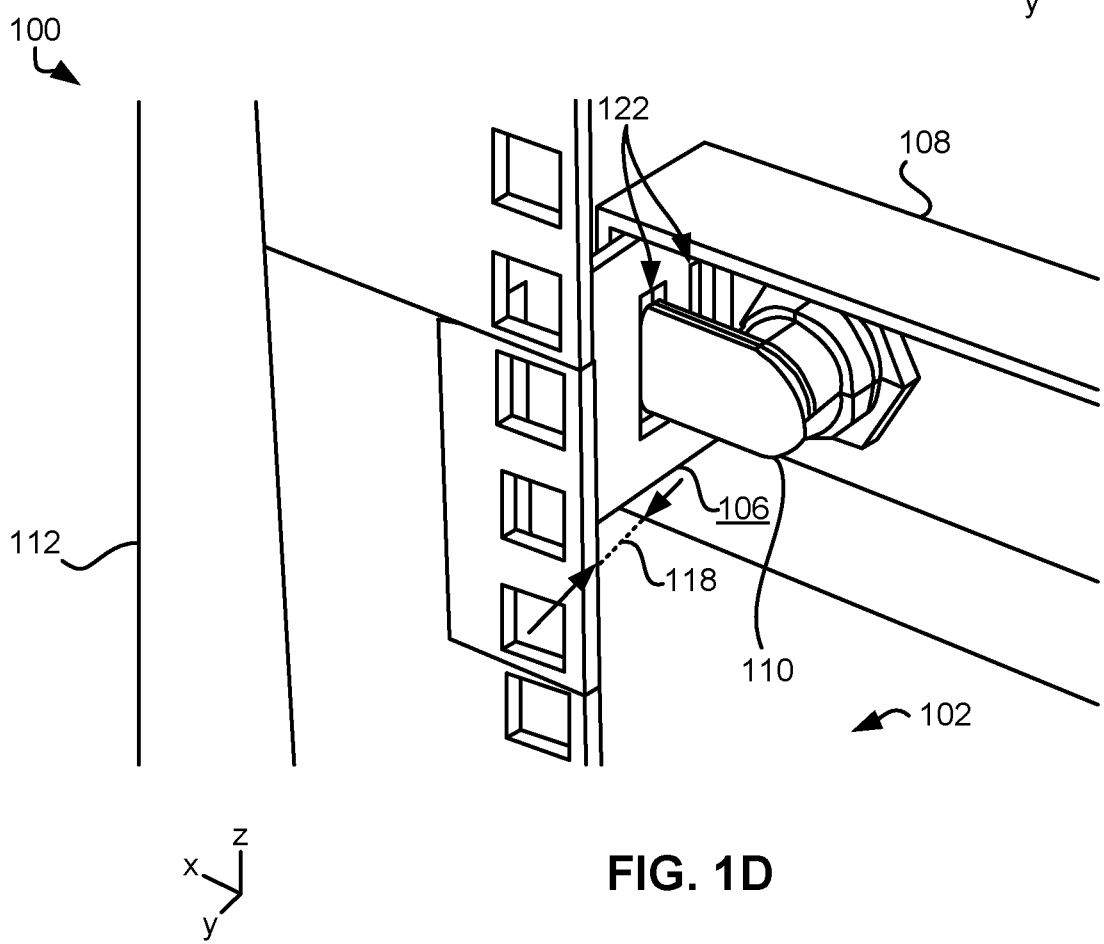
FIG. 1D is a partial internal view of a product having a bracket and a bezel in use with a computer rack, in accordance with one embodiment.

Referring now to FIG. 1D, a partial internal view of the first bracket 106 and the bezel 108 is illustrated in accordance with one embodiment. The lock 110 of the bezel 108 is shown selectively locking the bezel 108 to the first bracket 106. According to various embodiments, the lock 110 may include any type of locking mechanism that is configured to couple/decouple with a portion of the first bracket 106 to selectively lock the bezel 108 to the first bracket 106. According to one approach, the lock 110 may include a cam lock. According to another approach, the lock 110 may include a "T-handle" lock. According to another approach, the lock 110 may include a deadbolt lock. According to another approach, the lock 110 may include a key in knob (KIK) cylinder lock. According to yet another approach, the lock 110 may include a detent type lock.

The lock 110 may be configured to be engaged/unengaged using any entry key type. According to various embodiments, the entry key (not shown) of the lock 110 may preferably be customizable for computer racks used by a plurality of users. Entry key types may include, e.g., key type lock entry, card key lock entry, transponder key lock entry, etc. Additional types of locks are also contemplated, such as rotating dial locks, electronic combination locks, rotating dial combination locks, electronic key code locks, etc.

With joint reference to FIGS. 1C-1D, the first bracket 106 and/or the second bracket 120 may include a feature for allowing selection of the distance 118 of the bezel 108 from the computer rack 102. According to various approaches, as illustrated in FIGS. 1C-1D, the first bracket 106 and/or the second bracket 120 may include notches 122 for allowing selection of the distance 118 of the bezel 108 from the computer rack 102, where inserting and pivotally coupling the pivot portion 124 in different notches allows the distance 118 of the bezel 108 from the computer rack 102 to be altered.

According to other approaches, the first bracket 106 and/or the second bracket 120 may include a track/rail (not shown) that upon sliding lengthens and/or alternatively shortens the length of the first bracket 106 and/or the second bracket 120, and thereby translates to a varying of the distance 118 of the bezel 108 from the computer rack 102.

According to one approach, the distance 118 of the bezel 108 from the computer rack 102 may be minimized, e.g., where the outer face of the bezel 108 is about flush with the computer rack.

Figure 2A:
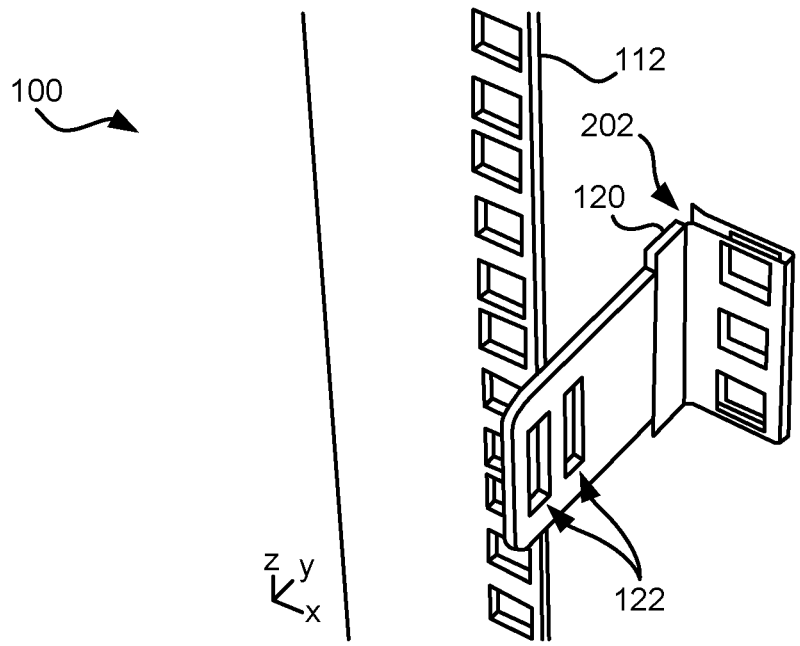
FIG. 2A is a perspective side view of an uncoupled bracket and computer rack rail, in accordance with one embodiment.

Referring now to FIG. 2A the second bracket 120 is illustrated as decoupled from the rail 112. Although the second bracket 120 is illustrated to include a "U-profile" clip shape 202 for gripping the rail 112 to establish a coupling with the rail 112, the manner in which the second bracket 120 couples to the rail 112 may vary depending on the embodiment. According to one embodiment, the second bracket 120 may additionally and/or alternatively include screw holes for coupling to the rail 112, e.g. using ear fastening. According to another embodiment, the second bracket 120 may additionally and/or alternatively include hooks for coupling to the rail 112, e.g., where the hooks of the second bracket 120 may pass through cutouts of the rail 112. It should be noted that any hooks and/or coupling type of the second bracket 120 may preferably not cover/obstruct the standard rail holes of the rail 112, e.g., see FIG. 2B.

The second bracket 120 may additionally and/or alternatively include adhesive strips for coupling to the rail 112.

It should be noted that the brackets 120, 106 and/or any coupling mechanisms of the brackets 120, 106 may preferably maintain a thin profile that upon coupling does not add any significant thickness to the rail 112. Implementing brackets 120, 106 that do not add any significant thickness to the rail 112 may desirably maintain standard computer rack dimensions, e.g., allowing standard computers to be added to slots of the computer rack described herein. Accordingly, product 104 may be installed/implemented in any existing computer rack.

Figure 2B:
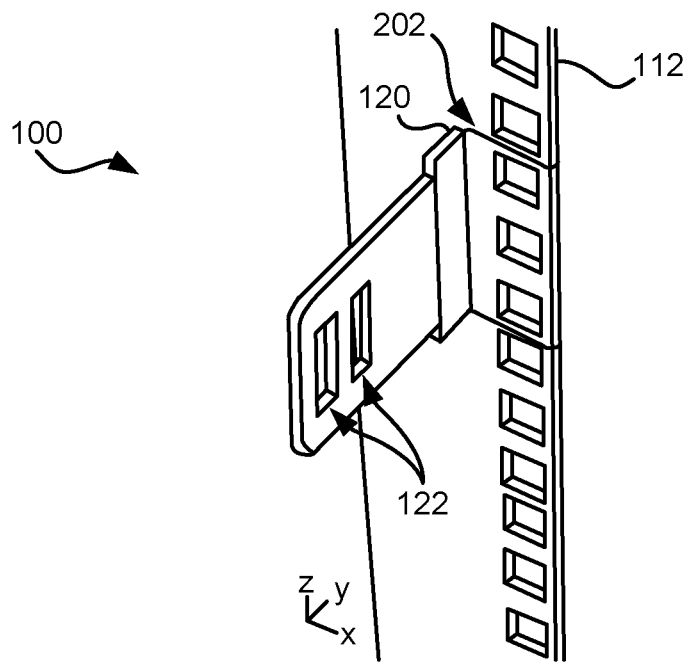
FIG. 2B is a partial perspective view of the bracket of FIG. 2A, coupled to a computer rack rail, in accordance with one embodiment.

Referring now to FIG. 2B, the second bracket 120 is illustrated coupled to the rail 112. Installation of a device in the slot corresponding to the location of the second bracket typically includes mounting the device using the holes in the rail. Accordingly, the mounting hardware may also extend through the holes in the second bracket 120, thereby locking the second bracket 120 to the rail 112.

It should be noted that although the first bracket 106 is not illustrated in FIGS. 2A-2B, the first bracket 106 may share one or more of the coupling types that are illustrated in FIGS. 2A-2B, and described herein.

Figure 3:
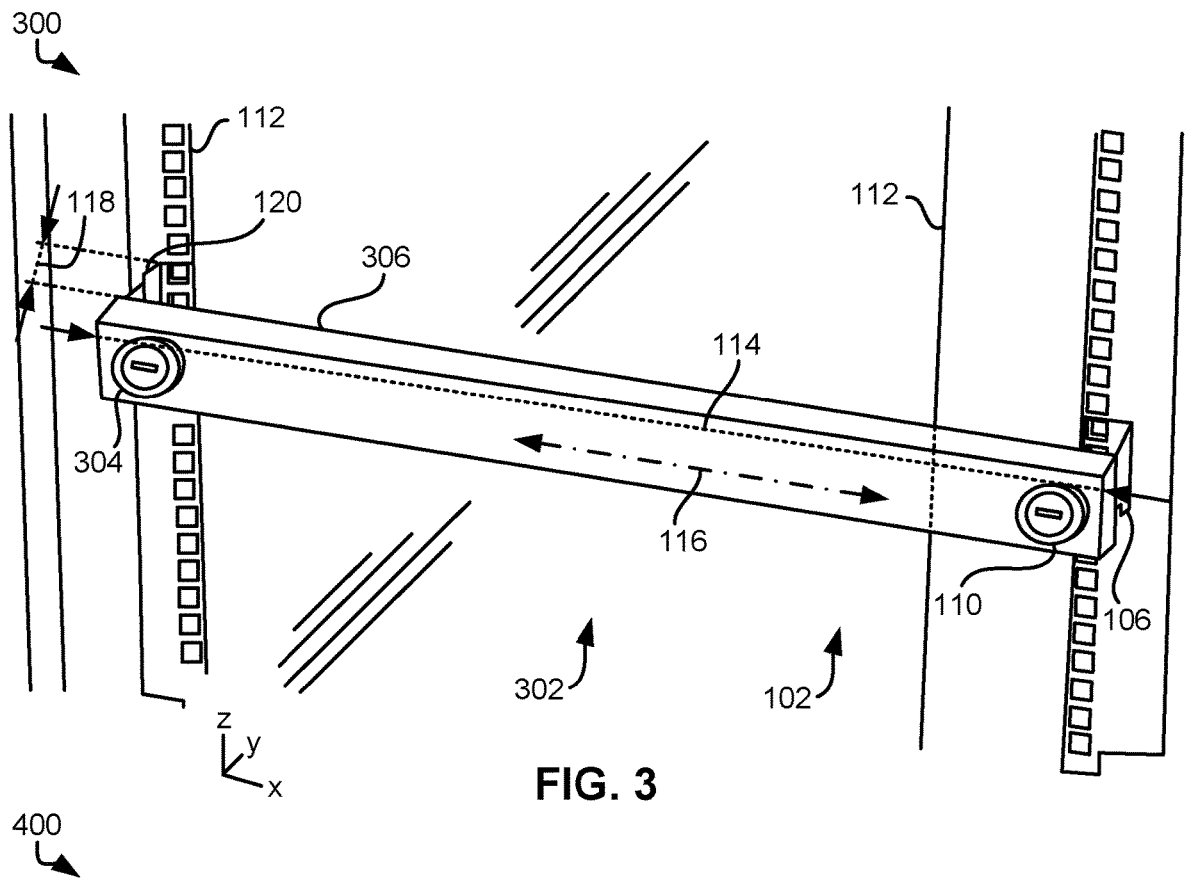
FIG. 3 is a partial perspective view of a product having a bracket and a bezel in use with a computer rack, in accordance with one embodiment.

According to various embodiments, a bezel may include a second lock, e.g., see FIG. 3.

FIG. 3 depicts a computer rack system 300, in accordance with one embodiment. As an option, the present system 300 may be implemented in conjunction with features from any other embodiment listed herein, such as those described with reference to the other FIGS. Of course, however, such system 300 and others presented herein may be used in various applications and/or in permutations which may or may not be specifically described in the illustrative embodiments listed herein. Further, the system 300 presented herein may be used in any desired environment.

It should be noted that product 302 may include similar elements and/or functionalities as product 104 of FIG. 1A. Accordingly, one or more elements of system 300 and system 100 and/or other systems described herein may share common element numberings.

A bezel 306 of product 302 may include a first lock 110 for selectively locking the bezel 306 to a first bracket 106. The bezel 306 of product 302 may also include a second lock 304 for selectively locking the bezel 306 to a second bracket 120.

According to one embodiment, the first and second locks 110, 304 may be the same type of lock. According to another embodiment, the first and second locks 110, 304 may be different types of locks. Similarly, the key and/or key types of the first and second locks 110, 304 may be the same, or a different combination type.

According to various embodiments, the bezel 306 may be configured to pivotally couple and/or selectively lock to either of the brackets 106, 120, depending on the embodiment. For example, it should be noted that although the first lock 110 is illustrated selectively locking the bezel 306 to the first bracket 106 and the second lock 304 is illustrated selectively locking the bezel 306 to the second bracket 120, according to various approaches, the bezel 306 may be configured to lock to the brackets regardless of which lock is adjacent the various brackets, e.g., the first lock 110 may also selectively lock the bezel 306 to the second bracket 120 and the second lock 304 may also selectively lock the bezel 306 to the first bracket 106 when the orientation of the locks is reversed from that shown. This may simplify use of the product 302. Moreover, the bezel 306 being configured to pivotally couple and/or selectively lock to either of the brackets 106, 120 may allow an installing user to vary the configuration and/or the pivoting direction of the bezel 306 in accordance with the spatial constraints that may exist in any computer rack system, e.g., such as those described herein.

According to other embodiments, the bezel 306 may be selectively locked to either or both of the brackets 106, 120 in response to the bezel 306 being urged straight towards both of the brackets 106, 120 during an installation of the bezel 306. In such embodiments, the installation of the bezel 306 and subsequent locking of the bezel 306 to either or both of the brackets 106, 120 may not include pivotally coupling the bezel 306 to one of the brackets 106, 120 prior to locking the other side of the bezel 306 to the other bracket, as described in some of the other embodiments. Rather, the bezel 306 may be urged straight toward both of the brackets 106, 120, upon which the first lock 110 may selectively lock the bezel 306 to the first bracket 106 and/or the second lock 304 may selectively lock the bezel 306 to the second bracket 120, e.g., using selective couple/decouple locking mechanism(s) as depicted in FIG. 1D.

Figure 4A:
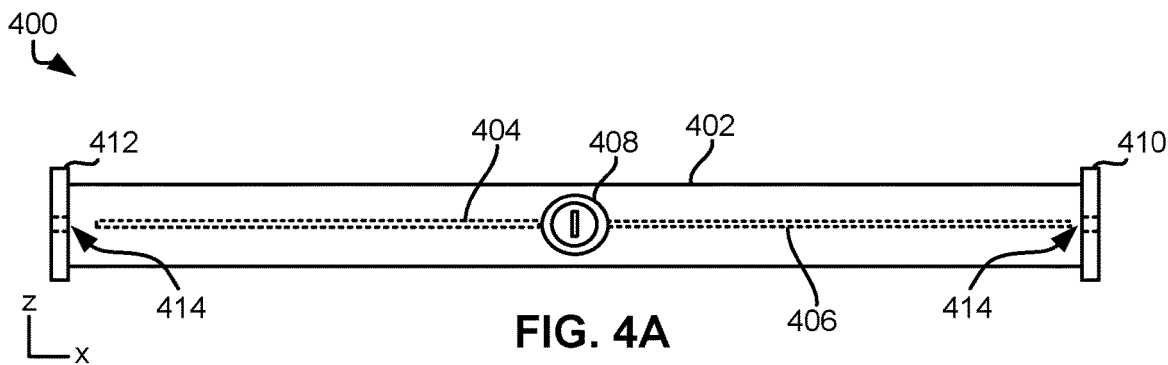
FIG. 4A is a front view of brackets and a bezel with a disengaged lock, in accordance with one embodiment.
Figure 4B:
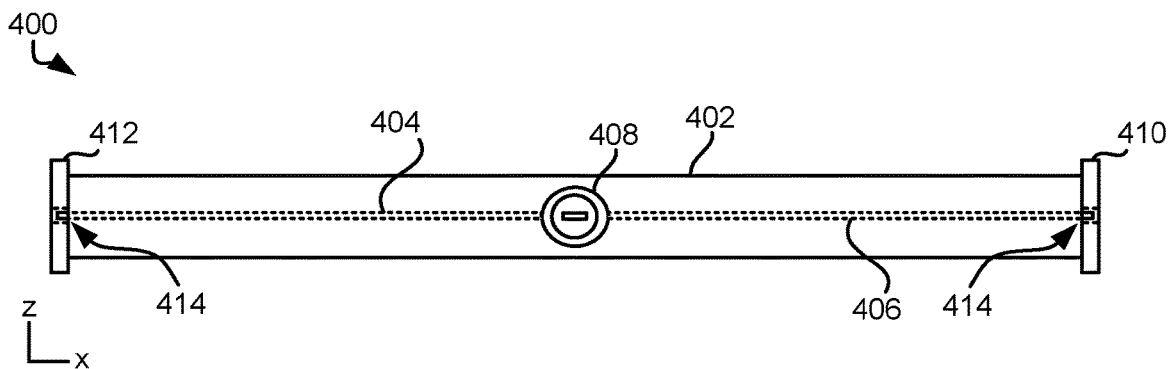
FIG. 4B is a front view of the brackets and the bezel of FIG. 4A with the lock engaged, in accordance with one embodiment.

Embodiments described herein may additionally and/or alternatively include a lock for locking the bezel to more than one bracket, e.g., see FIGS. 4A-4B.

FIGS. 4A-4B depict a system 400, in accordance with one embodiment. As an option, the present system 400 may be implemented in conjunction with features from any other embodiment listed herein, such as those described with reference to the other FIGS. Of course, however, such system 400 and others presented herein may be used in various applications and/or in permutations which may or may not be specifically described in the illustrative embodiments listed herein. Further, the system 400 presented herein may be used in any desired environment.

Referring now to FIG. 4A, system 400 includes a bezel 402. System 400 may also include a first bracket 410 and a second bracket 412.

The bezel 402 may include a lock 408. The lock 408 may be configured for selectively locking the bezel 402 to the first and second brackets 410, 412.

According to one embodiment, as illustrated in FIGS. 4A-4B, the lock 408 may be a slide lock. In such an embodiment, pins 404, 406 of the lock 408 may be selectively positionable between a retracted position (see FIG. 4A) and a locked position (see FIG. 4B) upon disengaging/engaging of the lock 408.

It should be noted that the bezel 402 is illustrated not locked to the brackets 410, 412 in FIG. 4A, although according to some embodiments, the bezel 402 may contact the brackets 410, 412 in the unlocked position.

Referring now to FIG. 4B, pins 404, 406 of the lock 408 are shown in the locked position, thereby selectively locking the bezel 402 to the first and second brackets 410, 412. According to various embodiments, the pins 404, 406 of the lock 408 may selectively lock the bezel 402 to the first and second brackets 410, 412 by contacting and/or residing in at least a portion of notches 414 of the first and second brackets 410, 412, respectively.

Figure 5:
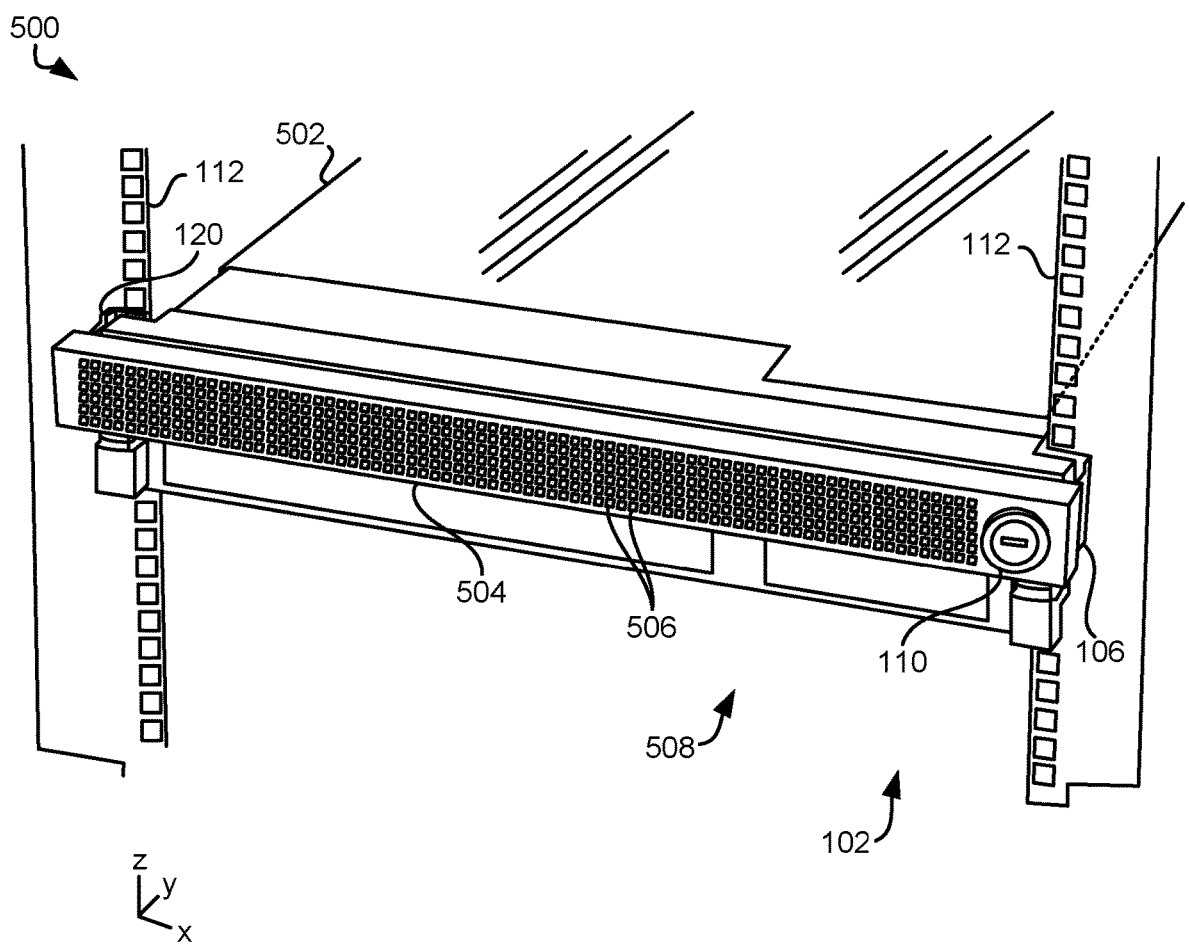
FIG. 5 is a partial perspective front view of a product having a bracket and a perforated bezel in use with a computer rack, in accordance with one embodiment.

FIG. 5 depicts a system 500, in accordance with one embodiment. As an option, the present system 500 may be implemented in conjunction with features from any other embodiment listed herein, such as those described with reference to the other FIGS. Of course, however, such system 500 and others presented herein may be used in various applications and/or in permutations which may or may not be specifically described in the illustrative embodiments listed herein. Further, the system 500 presented herein may be used in any desired environment.

It should be noted that product 508 of system 500 may include similar elements and/or functionalities as other products/systems described elsewhere herein. Accordingly, one or more elements of system 500 and other systems described herein may share common element numberings.

System 500 includes a bezel 504 covering the front of a computer 502 when locked to a first bracket 106 and/or second bracket 120.

As illustrated in FIG. 5, the bezel 504 may be perforated for allowing airflow therethrough, e.g., see perforated cutouts 506. The perforated bezel 504 may allow cooling airflow to access the front of the computer 502 when the bezel 504 is covering the front of the computer 502.

According to various embodiments, the cutout layout of the perforated bezel 504 may vary depending on the embodiment. According to one approach, the cutout layout of the perforated bezel 504 may be configured to conceal viewing of a graphical interface (not shown) of the computer 502. For example, a graphical interface may include, e.g., a light emitting diode (LED) indicator display, a data log display, a displayed serial number of the computer 502, etc.

According to another approach, the cutout layout of the perforated bezel 504 may be configured to allow viewing of a graphical interface of the computer 502. According to another approach, the cutout layout of the perforated bezel 504 may be configured to allow a user to access a selective portion of computer controls of the computer 502. According to yet another approach, the cutout layout of the perforated bezel 504 may be configured to not add any airflow impedance to the computer rack system 500 when locked to the first and/or second brackets 106, 120.

Figure 6:
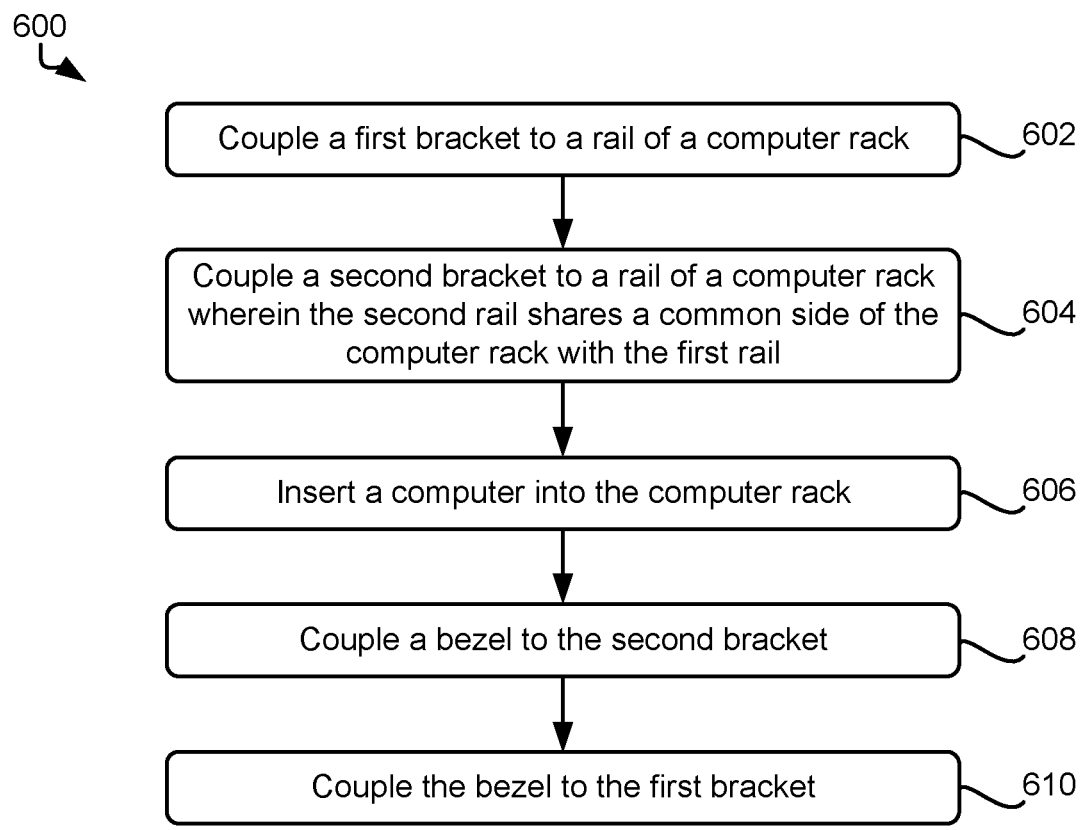
FIG. 6 is a flowchart of a method, in accordance with one embodiment.

FIG. 6 shows a method 600 for providing security and selective access to computers of a computer rack, in accordance with one embodiment. As an option, the present method 600 may be implemented to computer rack systems such as those shown in the other FIGS. described herein. Of course, however, this method 600 and others presented herein may be used to establish security and selective access for a wide variety of devices and/or purposes which may or may not be related to the illustrative embodiments listed herein. Further, the methods presented herein may be carried out in any desired environment. Moreover, more or less operations than those shown in FIG. 6 may be included in method 600, according to various embodiments. It should also be noted that any of the aforementioned features may be used in any of the embodiments described in accordance with the various methods.

Step 602 of method 600 includes coupling a first bracket to a rail of a computer rack. The coupling type may vary depending on the embodiment. As described elsewhere herein, according to various embodiments, the first bracket may be configured to be used with and/or receive coupling hardware, e.g., screws, clips, hooks, etc., to at least in part establish the coupling to the rail of the computer rack.

Step 604 of method 600 includes coupling a second bracket to a rail of a computer rack, where the second rail shares a common side of the computer rack with the first rail. Coupling the second bracket to a rail of a computer rack that shares a common side of the computer rack with the first rail may allow a bezel to couple to both of the brackets, e.g., see operations 608-610.

The second bracket may additionally and/or alternatively be coupled to a portion of the second rail of the computer rack that is located at about the same relative rail height in the computer rack as the rail to which the first bracket is coupled.

Operation 606 of method 600 includes inserting a computer (or equivalently, any device) into the computer rack. According to one embodiment, during insertion of the computer into the computer rack and/or once the computer is fully inserted into the computer rack, the computer may be secured and/or coupled to the computer rack, e.g., via a coupling of the computer to a slot rail, via a coupling of the computer to a rail of the computer rack, via a coupling of the computer to any other structural portion of the computer rack, etc.

Alternatively, according to another embodiment, the computer may remain uncoupled to any portion of the computer rack once the computer is fully inserted into the computer rack, e.g., the computer rests freely on a panel located in the computer rack.

It should be noted that the computer may be added to an empty slot of the computer rack at any time. For example, according to one approach, the computer may be inserted into a slot of the computer rack prior to adding any component, e.g., first bracket, second bracket, a bezel, etc., to the computer rack.

Operation 608 of method 600 includes coupling a bezel to the second bracket. According to various embodiments, the bezel may be pivotally coupled to the second bracket. Pivotally coupling the bezel to the second bracket may allow the bezel to be selectively pivot out of the way of a computer that is being inserted and/or removed from the computer rack. Pivotally coupling the bezel to the second bracket may additionally and/or alternatively allow the bezel to be selectively pivoted out of the way while a user accesses the computer associated with the bezel.

Operation 610 of method 600 includes coupling the bezel to the first bracket. As described in embodiments herein, the bezel may be coupled to the first bracket using a lock. According to one approach, the lock may be an integrated portion of the bezel. According to another embodiment, the lock may be an integrated portion of the computer rack. According to another embodiment, the lock may be an integrated portion of the first bracket. In such approaches, the lock may be selectively lockable by a user.

According to various embodiments, the bezel may cover a front of the computer when the bezel is locked to the first bracket. In such embodiments, the first and second brackets may reside on a side of the computer rack closest to the front of the computer.

According to other embodiments, the bezel may cover a back of the computer when the bezel is locked to the first bracket. In such embodiments, the first and second brackets may reside on a side of the computer rack closest to the back of the computer.

It should be noted that brackets and a corresponding bezel may be added to more than one side of a computer rack to provide selective security to more than one side of a computer that are accessible from the outside of the computer rack. Implementing brackets and a corresponding bezel to more than one side of a computer rack may be desirable and provide all around privacy/selective security in the computer rack.

FIGS. 7A-7D depict a system 700 in accordance with one embodiment whereby a bezel transitions from an uncoupled position to a locked position relative to a computer rack. As an option, the present system 700 may be implemented in conjunction with features from any other embodiment listed herein, such as those described with reference to the other FIGS. Of course, however, such system 700 and others presented herein may be used in various applications and/or in permutations which may or may not be specifically described in the illustrative embodiments listed herein. Further, the system 700 presented herein may be used in any desired environment.

It should be noted that system 700 may include similar elements and/or functionalities as other product of system described elsewhere herein. Accordingly, one or more elements of system 700 may share common element numberings with one or more elements of other systems described elsewhere herein.

Figure 7A:
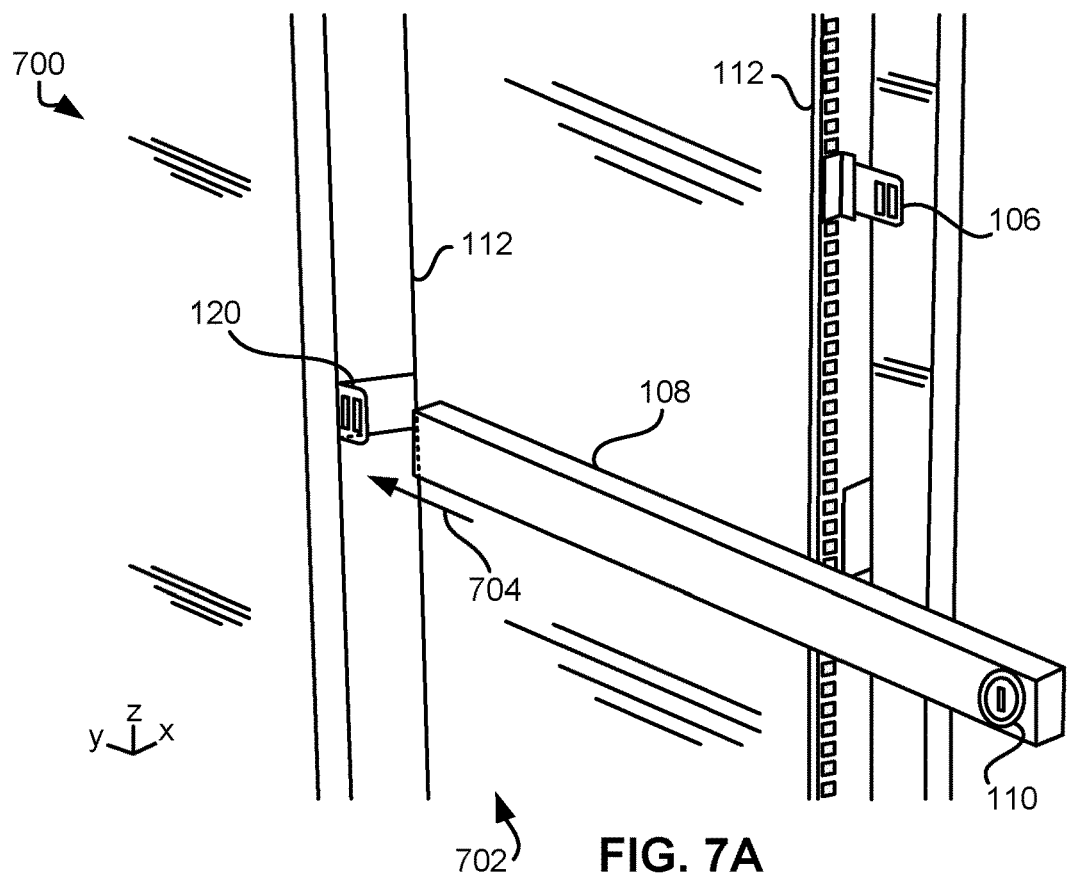
FIGS. 7A-7D are partial perspective front views of a product having a bezel transitioning from an uncoupled position to a selective locked position relative to a computer rack, in accordance with one embodiment.

Referring now to FIG. 7A, system 700 includes a first bracket 106 and a second bracket 120. The first bracket 106 and the second bracket 120 are illustrated coupled to rails 112 of the computer rack 702.

System 700 also includes a bezel 108, which is illustrated uncoupled from the computer rack 702 in FIG. 7A. It may be noted that the bezel 108 is illustrated aligned with the second bracket 120 in an insertion direction 704.

Figure 7B:
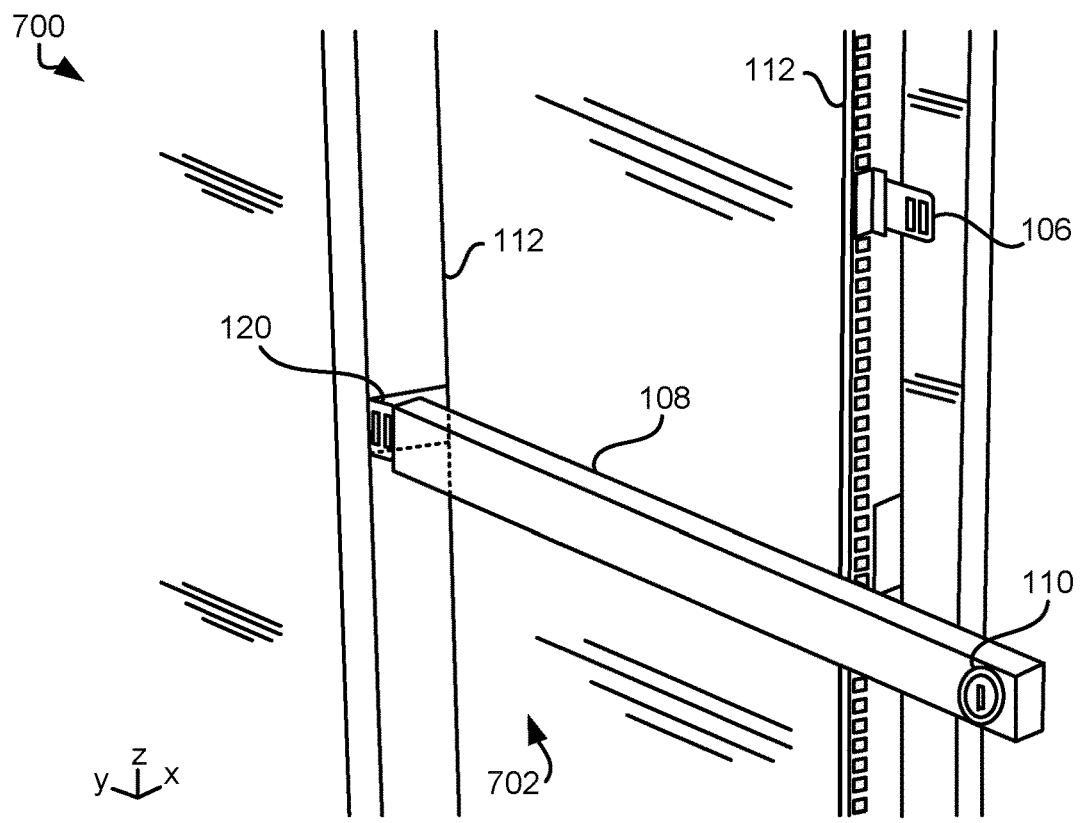

Referring now to FIG. 7B, the bezel 108 is illustrated coupling with the second bracket 120. As described elsewhere herein the coupling type may vary depending on the embodiment. For example, FIGS. 7A-7D illustrate a pivotable coupling type, e.g., see bezel 108 pivot toward the first bracket 106 in FIGS. 7B-7D.

According to one embodiment, the bezel 108 may be configured to couple to a pin (not shown) of the second bracket 120 upon coupling with the second bracket 120, where the pin is configured to allow the bezel 108 to pivot toward and/or away the first bracket 106 for coupling with the first bracket 106.

According to another embodiment, the bezel 108 may be configured to couple to a tab portion of the second bracket 120 upon coupling with the second bracket 120. According to one approach, the tab portion may be coupled to a pivotable portion of the second bracket 120 configured to allow the bezel 108 and tab portion to pivot toward and/or away the first bracket 106 for coupling with the first bracket 106.

According to one embodiment, the pivotable portion of the second bracket 120 may include a hinge for allowing pivoting of the bezel 108 toward and/or away from the first bracket 106 for coupling with the first bracket 106.

Figure 7C:
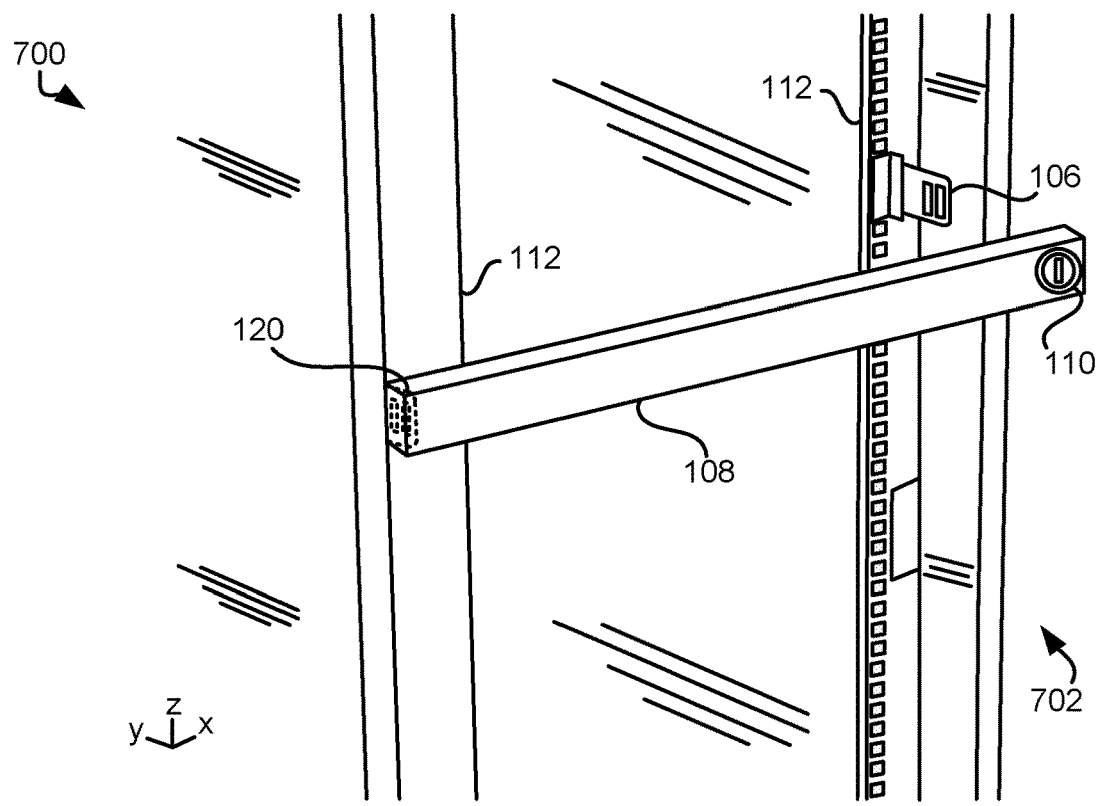

Referring now to FIG. 7C, the bezel 108 is illustrated pivoting toward the first bracket 106. The bezel 108 includes a lock 110 for selectively locking the bezel 108 to the first bracket 106. Pivoting the bezel 108 toward the first bracket 106 may allow the bezel 108 to contact the first bracket 106 for selective locking to the first bracket 106.

Although the bezel 108 is illustrated pivoting from the second bracket 120 toward the first bracket 106, according to other embodiments, the bezel may be configured to hinge along a bottom or top portion of the brackets 106, 120, where the bezel 108 may pivot upward or downward to couple and/or lock the bezel 108 to the brackets 106, 120.

Figure 7D:
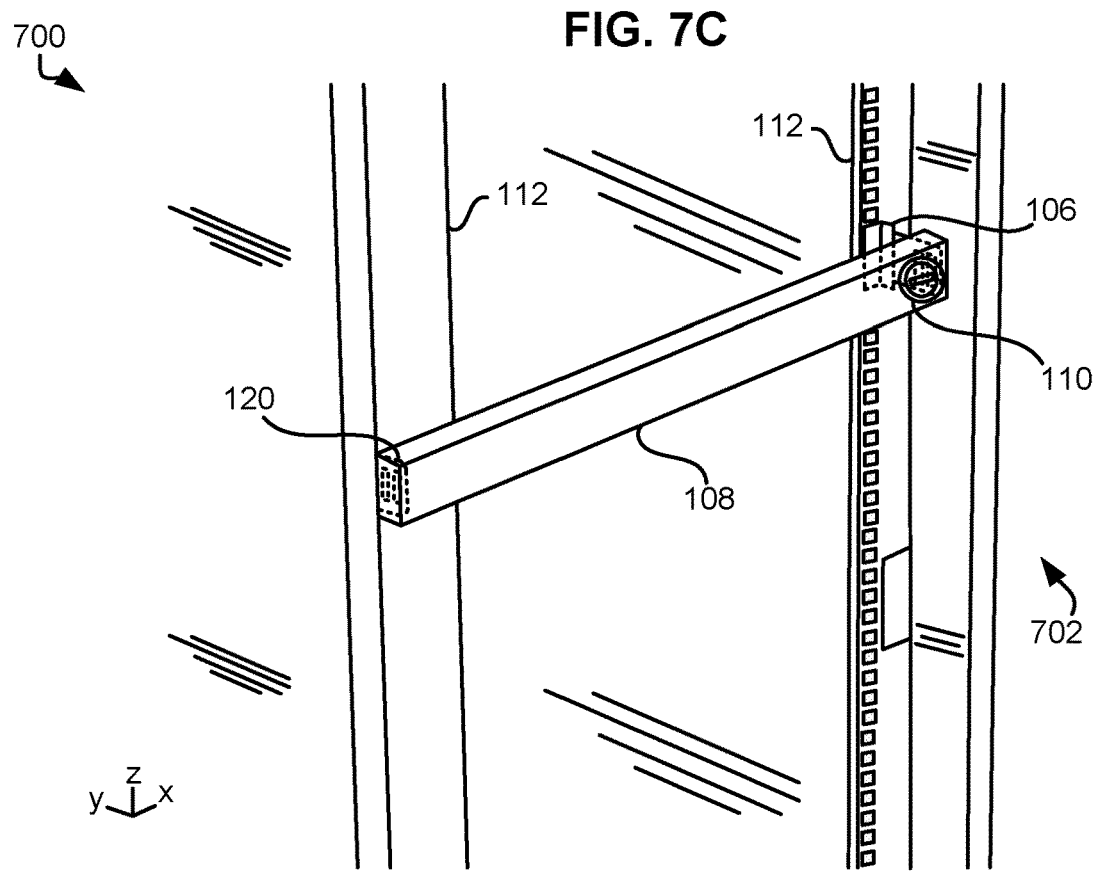

Referring now to FIG. 7D, the bezel 108 is illustrated selectively locked to the first bracket 106.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
  a first bracket having features configured to couple to a first rail of a computer rack having the first rail and a second rail, the first rail having an array of holes therein, the second rail having an array of holes therein;
  a bezel having a lock configured to selectively lock the bezel to the first bracket when the lock is locked, wherein the bezel is selectively detachable from the first bracket when the lock is unlocked; and
  a second bracket having features configured to couple to the second rail of the computer rack and configured to pivotally couple with the bezel,
  wherein the bezel is selectively detachable from the second bracket,
  wherein the first bracket is configured to not completely cover and/or completely obstruct any of the holes in the first rail when coupled to the first rail,
  wherein the first bracket includes a plurality of holes, wherein the individual holes of the plurality of holes of the first bracket have a shape and dimension that is about the same as a shape and dimension of a periphery of a respective one of the holes of the first rail,
  wherein the second bracket is configured to not completely cover and/or completely obstruct any of the holes in the second rail when coupled to the second rail, wherein the second bracket includes a plurality of holes, wherein the individual holes of the plurality of holes of the second bracket have a shape and dimension that is about the same as a shape and dimension of a periphery of a respective one of the holes of the second rail.

2. The product as recited in claim 1, wherein the bezel has a pivot portion that pivotally couples with a notch of the second bracket to selectively secure the bezel to the second bracket.

3. The product as recited in claim 1, wherein the bezel has a second lock configured to selectively lock the bezel to the second bracket, wherein no portion of the first bracket extends through inner peripheries of the holes in the first rail when coupled to the first rail, wherein no portion of the second bracket extends through inner peripheries of the holes in the second rail when coupled to the second rail.

4. The product as recited in claim 1, wherein the lock is configured to selectively lock the bezel to the first and second brackets, wherein at least a portion of a tab portion of the first bracket and at least a portion of a tab portion of the second bracket reside within a concave portion of the bezel when the bezel is locked to the first and second brackets.

5. The product as recited in claim 1, wherein a width of the bezel along a longitudinal axis thereof is adjustable.

6. The product as recited in claim 1, wherein the bezel includes a mechanism configured to adjust a distance of an entirety of the bezel from the computer rack.

7. The product as recited in claim 1, wherein the first bracket includes a feature configured to allow selection of a distance of the bezel from the computer rack when the bezel is locked to the first bracket.

8. The product as recited in claim 1,
wherein the bezel is perforated to allow airflow therethrough,
wherein the perforated bezel includes a cutout layout configured to allow viewing of a graphical interface of a computer stored in the computer rack,
wherein the shape of the individual holes of the plurality of holes of the first bracket is a square, wherein the shape of the respective one of the holes of the second rail is a square,
wherein no portion of the first bracket extends through inner peripheries of the holes in the first rail when coupled to the first rail,
wherein no portion of the second bracket extends through inner peripheries of the holes in the second rail when coupled to the second rail,
wherein the bezel includes a mechanism that is configured to be powered by an electrical current to adjust a distance of the bezel from the computer rack,
wherein the lock is configured to selectively lock the bezel to the first and second brackets,
wherein at least a portion of a tab portion of the first bracket and at least a portion of a tab portion of the second bracket reside within a concave portion of the bezel when the bezel is locked to the first and second brackets.

9. A method, comprising:
coupling a first bracket to a first rail of a computer rack, the first rail having an array of holes therein;
coupling a second bracket to a second rail of the computer rack, the second rail having an array of holes therein;
coupling a bezel to the second bracket by inserting a tab portion of the second bracket into the bezel along an insertion direction;
pivoting the bezel and the tab portion toward the first bracket to couple the bezel with the first bracket, the tab portion being coupled to a pivotable portion of the second bracket; and
coupling the bezel to the first bracket,
wherein the second bracket does not completely cover and/or completely obstruct any of the holes in the second rail of the computer rack when coupled to the second rail of the computer rack,
wherein no portion of the second bracket extends through inner peripheries of the holes in the second rail when coupled to the second rail,
wherein the inner peripheries of the holes in the second rail are square shaped,
wherein the first bracket does not completely cover and/or completely obstruct any of the holes in the first rail of the computer rack when coupled to the first rail of the computer rack,
wherein no portion of the first bracket extends through inner peripheries of the holes in the first rail when coupled to the first rail,
wherein the inner peripheries of the holes in the first rail are square shaped.

10. The method as recited in claim 9, comprising:
inserting a device into the computer rack, wherein the bezel covers a front of the device when the bezel is locked to the first bracket, wherein the insertion direction is substantially parallel to a longitudinal axis of the bezel; and
pivoting the bezel to couple the bezel with the first bracket, wherein the bezel is configured to hinge along bottom or top portions of the first and second brackets to pivot the bezel.

11. The method as recited in claim 9, comprising:
inserting a device into the computer rack, wherein the bezel covers a back of the device when the bezel is locked to the first bracket;
pivoting the bezel and the tab portion toward the first bracket to couple the bezel with the first bracket, the tab portion being coupled to a pivotable portion of the second bracket; and
adjusting a distance of the bezel from the computer rack using a mechanism of the bezel that is configured to be powered by an electrical current to adjust the distance of the bezel from the computer rack,
wherein the bezel is perforated to allow airflow therethrough,
wherein the perforated bezel includes a cutout layout configured to allow viewing of a graphical interface of a computer stored in the computer rack,
wherein the inner peripheries of the holes in the first rail are square shaped,
wherein the inner peripheries of the holes in the second rail are square shaped.

12. A system, comprising:
a computer rack;
a first bracket coupled to a first rail of the computer rack, the first rail having a linear array of holes;
a bezel having a lock configured to selectively lock the bezel to the first bracket; and
a second bracket coupled to a second rail of the computer rack, the second rail having a linear array of holes,
wherein the second bracket has a plurality of holes such that the second bracket does not completely cover and/or completely obstruct any of the linear array of holes of the second rail when coupled to the second rail of the computer rack, wherein the individual holes of the plurality of holes of the second bracket have a shape and dimension that is about the same as a shape and dimension of a periphery of a respective hole of the array of holes of the second rail, wherein the first bracket has a plurality of holes such that the second bracket does not completely cover and/or completely obstruct any of the linear array of holes of the first rail when coupled to the first rail of the computer rack, wherein the individual holes of the plurality of holes of the first bracket have a shape and dimension that is about the same as a shape and dimension of a periphery of a respective hole of the array of holes of the first rail.

13. The system as recited in claim 12, wherein the second bracket has a plurality of second holes that are configured to receive coupling hardware to enable coupling of the second bracket to the second rail.

14. The system as recited in claim 13, wherein the lock is configured to selectively lock the bezel to the second bracket, wherein the lock is a slide lock with at least two pins, wherein the pins are independently positionable between a retracted position and a locked position, wherein the pins reside within a longitudinal extent of the bezel when the pins are in the retracted position.

15. The system as recited in claim 12, wherein a width of the bezel along a longitudinal axis thereof is adjustable.

16. The system as recited in claim 12, wherein the bezel includes a mechanism configured to adjust a distance of the bezel from the computer rack.

17. The system as recited in claim 12, wherein the first bracket includes a feature configured to allow selection of a distance of the bezel from the computer rack.

18. The system as recited in claim 12, wherein the bezel covers an opening of an empty slot of the computer rack when locked to the first bracket.

19. The system as recited in claim 12, wherein the bezel covers a front opening of a slot of the computer rack when locked to the first bracket.

20. The system as recited in claim 12,
wherein the bezel covers a back opening of a slot of the computer rack when locked to the first bracket,
wherein the bezel is perforated to allow airflow therethrough,
wherein the perforated bezel includes a cutout layout configured to allow viewing of a graphical interface of a computer stored in the computer rack,
wherein the holes of the first rail are square shaped,
wherein the holes of the second rail are square shaped,
wherein the holes of the first bracket are square shaped,
wherein the holes of the second bracket are square shaped,
wherein no portion of the first bracket extends through inner peripheries of the linear array of holes of the first rail when coupled to the first rail,
wherein no portion of the second bracket extends through inner peripheries of the linear array of holes of the second rail when coupled to the second rail,
wherein the bezel includes a mechanism that is configured to be powered by an electrical current to adjust a distance of the bezel from the computer rack,
wherein the lock is configured to selectively lock the bezel to the second bracket,
wherein at least a portion of a tab portion of the first bracket and at least a portion of a tab portion of the second bracket reside within a concave portion of the bezel when the bezel is locked to the first and second brackets.

* * * * *